United States Patent [19]
Schaffer

[11] Patent Number: 5,847,274
[45] Date of Patent: Dec. 8, 1998

[54] ON/OFF AND MODULATED/DUTY-CYCLED SOLENOID TESTER

[76] Inventor: Larry Schaffer, 5905 Magnolia La., Lakeland, Fla. 33809-6216

[21] Appl. No.: 980,812

[22] Filed: Dec. 1, 1997

Related U.S. Application Data

[62] Division of Ser. No. 671,523, Jun. 27, 1996, Pat. No. 5,712,420.

[51] Int. Cl.⁶ .................................................. G01M 13/02
[52] U.S. Cl. ............................................................. 73/118.1
[58] Field of Search ..................................... 73/1.72, 118.1

[56] References Cited

U.S. PATENT DOCUMENTS

| | | | |
|---|---|---|---|
| 3,273,384 | 9/1966 | Flaugher | 73/118.1 |
| 3,302,107 | 1/1967 | Flaugher et al. | 73/118.1 X |
| 4,425,620 | 1/1984 | Batcheller et al. | 701/52 |
| 4,593,556 | 6/1986 | Wehr | 73/118.1 |
| 4,854,165 | 8/1989 | Joy | 324/415 X |
| 4,901,561 | 2/1990 | Glowczewski | 73/118.1 |
| 5,060,177 | 10/1991 | Gregory et al. | 73/118.1 X |
| 5,129,259 | 7/1992 | View et al. | 73/118.1 |
| 5,460,582 | 10/1995 | Palansky et al. | 477/138 |
| 5,467,644 | 11/1995 | Schaffer | 73/118.1 |
| 5,515,272 | 5/1996 | Sakai et al. | 73/118.1 X |

FOREIGN PATENT DOCUMENTS

| | | | |
|---|---|---|---|
| 116236 | 7/1982 | Japan | 73/118.1 |
| 67540 | 3/1988 | Japan | 73/118.1 |
| 77045 | 4/1991 | Japan | 73/118.1 |
| 260975 | 1/1970 | Russian Federation | 73/118.1 |
| 494644 | 12/1975 | Russian Federation | 73/118.1 |
| 20-9585 | 10/1979 | United Kingdom | 73/118.1 |

*Primary Examiner*—Thomas P. Noland
*Attorney, Agent, or Firm*—George A. Bode; Lisa D. Charouel; Bode & Associates

[57] ABSTRACT

An apparatus for performing on/off or modulated/duty-cycled testing on a solenoid in a computer controlled automatic transmission when the solenoid is removed from the vehicle or while the solenoid is in the vehicle. The apparatus comprises: three jacks, a switch when actuated for performing a diode test, circuitry for electrically connecting the apparatus to the solenoid and preventing over current and over voltage surges, circuitry for performing the on/off testing, circuitry for performing the modulated/duty-cycled test and pneumatic components for supplying air pressure to the solenoid.

10 Claims, 3 Drawing Sheets

ON/OFF AND MODULATED/DUTY-CYCLED SOLENOID TESTER

This is a division of application Ser. No. 08/671,523, filed Jun. 27, 1996, and now U.S. Pat. No. 5,712,420.

BACKGROUND OF THE INVENTION

1. Field of the Invention

The present invention relates to an apparatus for transmission testing and, particularly, to a single testing unit for performing variable voltage (on/off) or modulated/duty-cycled testing of a solenoid in a computer controlled automatic transmission.

2. General Background

There are many manufactures of computer controlled automobile transmissions. Each manufacture's transmission may utilize a different type of control signal to the electronic control module (ECM) to activate one of the several solenoids. Furthermore, the solenoids may be of on/off or modulated/duty-cycled type of operation. Therefore, troubleshooting a solenoid of a computer controlled automatic transmission becomes complicated.

Several devices have been patented which are aimed at transmission testing.

U.S. Pat. Nos. 3,273,384 and 3,302,107 are directed to hydraulics and individual component applications and testing and are not related to the computer controlled automatic transmission of today's vehicles.

U.S. Pat. No. 4,854,165 is directed to testing electrical switches that are responsive to fluid under pressure. Although the invention is directed to on/off solenoid testing, modulated/duty-cycled testing is not performed.

U.S. Pat. No. 5,060,177 is directed to testing only a specific Chrysler™ transmission by simulating shifting conditions just as the onboard computer might do and is very complex in operation.

U.K. Patent Application GB 2 019 585A is directed to reading and checking electrical circuits within the transmissions of commercial applications and not to passenger automobiles.

The known testing devices do not address the need for a single unit testing device capable of testing a variable voltage (on/off) or modulated/duty-cycled solenoid for a computer controlled automatic transmission.

SUMMARY OF THE PRESENT INVENTION

The preferred embodiment of the apparatus of the present invention solves the aforementioned problems in a straightforward and simple manner. What is provided is a single unit designed to perform both on/off and modulated/duty-cycled testing of a solenoid in a computer controlled transmission.

In view of the above an object of the invention is to provide an electrical connection for providing power to the single unit while bench testing the solenoid when the solenoid is removed from the vehicle or when the solenoid is in the vehicle. The electrical connection is adapted for connection to a vehicle's cigarette lighter.

A further object of the invention is to provide a faceplate having simple operator controls for selecting the on/off test or the modulated/duty-cycled test, as well as, the testing parameters for the modulated/duty-cycled solenoid.

A further object of the invention is to provide pneumatic components for connecting any regulated air supply available in most repair shops to the intake port of the solenoid.

A further object of the invention is to provide circuitry for performing over current and over voltage protection, circuitry for performing the on/off test and circuitry for performing the modulated/duty-cycled test having overheating protection.

In view of the above, the invention is capable of modulated/duty-cycled testing of U.S. built pressure control variable force solenoids and modulated converter clutch solenoids and most Asian pressure control solenoids. The invention is further capable of on/off testing most on/off solenoids and diodes of the solenoids having a resistance of 15 ohms or higher.

BRIEF DESCRIPTION OF THE DRAWING

For a further understanding of the nature and objects of the present invention, reference should be had to the following description taken in conjunction with the accompanying drawing in which like parts are given like reference numerals and, wherein.

DETAILED DESCRIPTION OF THE PREFERRED EMBODIMENT

Figure 1:
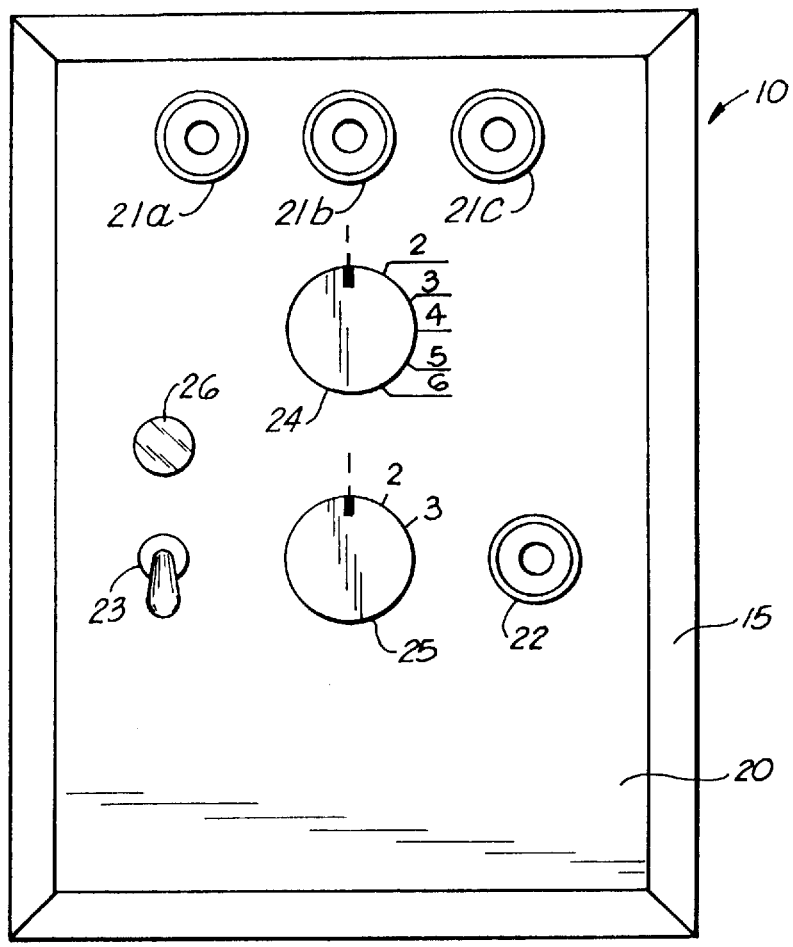
FIG. 1 illustrates the testing unit housing and faceplate or control panel of the preferred embodiment of the apparatus of the present invention.

Referring now to the drawing, and in particular FIG. 1, the apparatus of the present invention is designated generally by the numeral 10. Apparatus 10 of FIG. 1 is comprised of a faceplate 15, pneumatic circuit 40 (FIG. 2) and suitable housing 16. Disposed within housing 16 is electronic circuitry 51, 50 and 60 (FIGS. 3 and 4) for performing the on/off or modulated/duty-cycled test on a solenoid.

Faceplate 15 acts as a heat sink for the electrical circuitry of the present invention and has thereon an air pressure gauge 11, voltmeter 20, light emitting diodes 25 and 30 for providing the visual indicators for the operator of the present invention. In the exemplary embodiment, pressure gauge 11 is a 0 to 60 psi (pounds per square inch) pressure indicator for monitoring the air pressure conditions during testing thereby checking the pneumatic integrity of the solenoid under test. Voltmeter 20 is a 0 to 5 volt direct current analog meter which indicates to the user the output voltage to jack 23. Light emitting diodes 25 and 30 are red light emitting diodes; however, any color or other suitable light source may be used.

Figure 3:
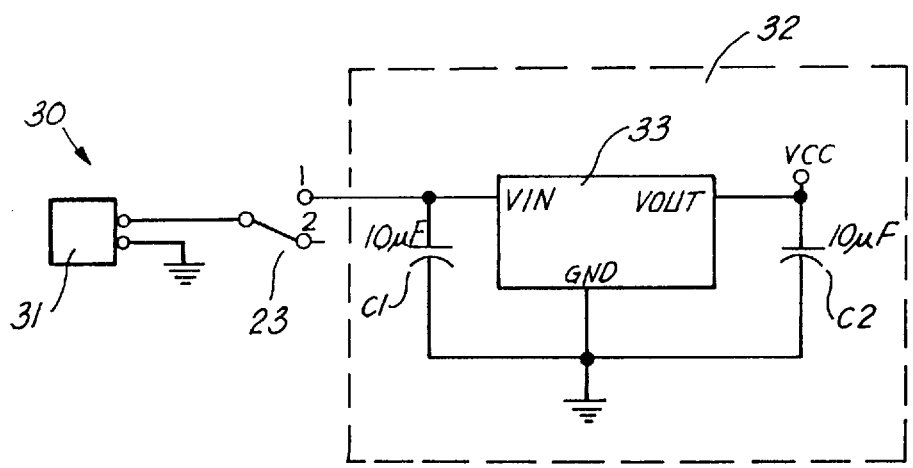
FIG. 3 illustrates the power connections, power protection circuitry and the on/off solenoid testing circuitry of the embodiment of FIG. 1; and, FIG. 4 illustrates the circuitry for performing the modulated/duty-cycled solenoid testing of the embodiment of FIG. 1.
Figure 4:
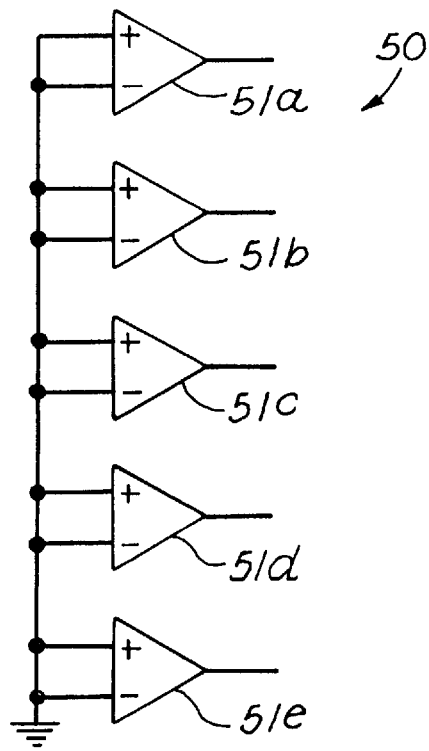
Figure 5:
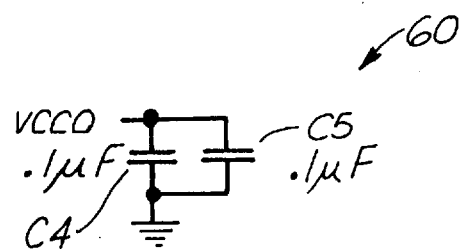

Faceplate 15 is further comprised of three input jacks 21, 22 and 23 for electrically connecting the solenoid to electrical circuitry 50 and 60 (FIGS. 3 and 4). Jacks 21 and 22 are used when performing the on/off solenoid test on an on/off solenoid. Jack 21 is a red push-in connection used to insert a red electrical lead thereby electrically connecting the testing device to the positive side of the on/off solenoid. Jack 22 is a black push-in connection used to insert a black electrical lead thereby electrically connecting the testing device to ground or the negative side of the on/off solenoid.

Faceplate 15 is further provided with several operator controls for selecting the testing mode, as well as, testing parameters. Push button switch 26 is provided to perform the variable voltage (on/off) solenoid test. Push button switch 24 initiates a diode test on an on/off solenoid when actuated (switch 26 needs to be deactivated before performing the diode test since it is a momentary switch, not a maintain switch); otherwise, push button switch 24 connects jack 22 to ground. Switch 29 turns on the control circuit 60 (FIG. 4) for performing the modulated/duty-cycled test. Selector switch 27 selects a high or low Hertz (frequency) for the duty-cycled test. Potentiometer 28 adjusts the voltage output to jack 23 and has a 0–5 volt range. Range adjustment 28 is used to calibrate apparatus 10 (and, therefore, limits the high end voltage) since each solenoid is different. Jack 23 is a red push-in connection used to insert a red electrical lead thereby electrically connecting the testing device to the positive side of a modulated/duty-cycled solenoid. Potentiometer 31 controls the duty-cycle output during the modulated/duty-cycled test procedure. It has a four (4) volt span: 1–5 volts. When duty cycle 31 is maximized, range adjustment 28 is used to set the maximum voltage at 5 volts. In the exemplary embodiment, selector switch 27 is a rotary switch. Switch 29 is a push button switch. Push button switch 24 is a conventional double pole-double throw switch.

The three jacks 21, 22 and 23 in combination with switch 24 allow the apparatus to connect to a solenoid (not shown) for performing one of two solenoid testing modes whereby various types of manufactured solenoids are accommodated and a diode test.

Figure 2:
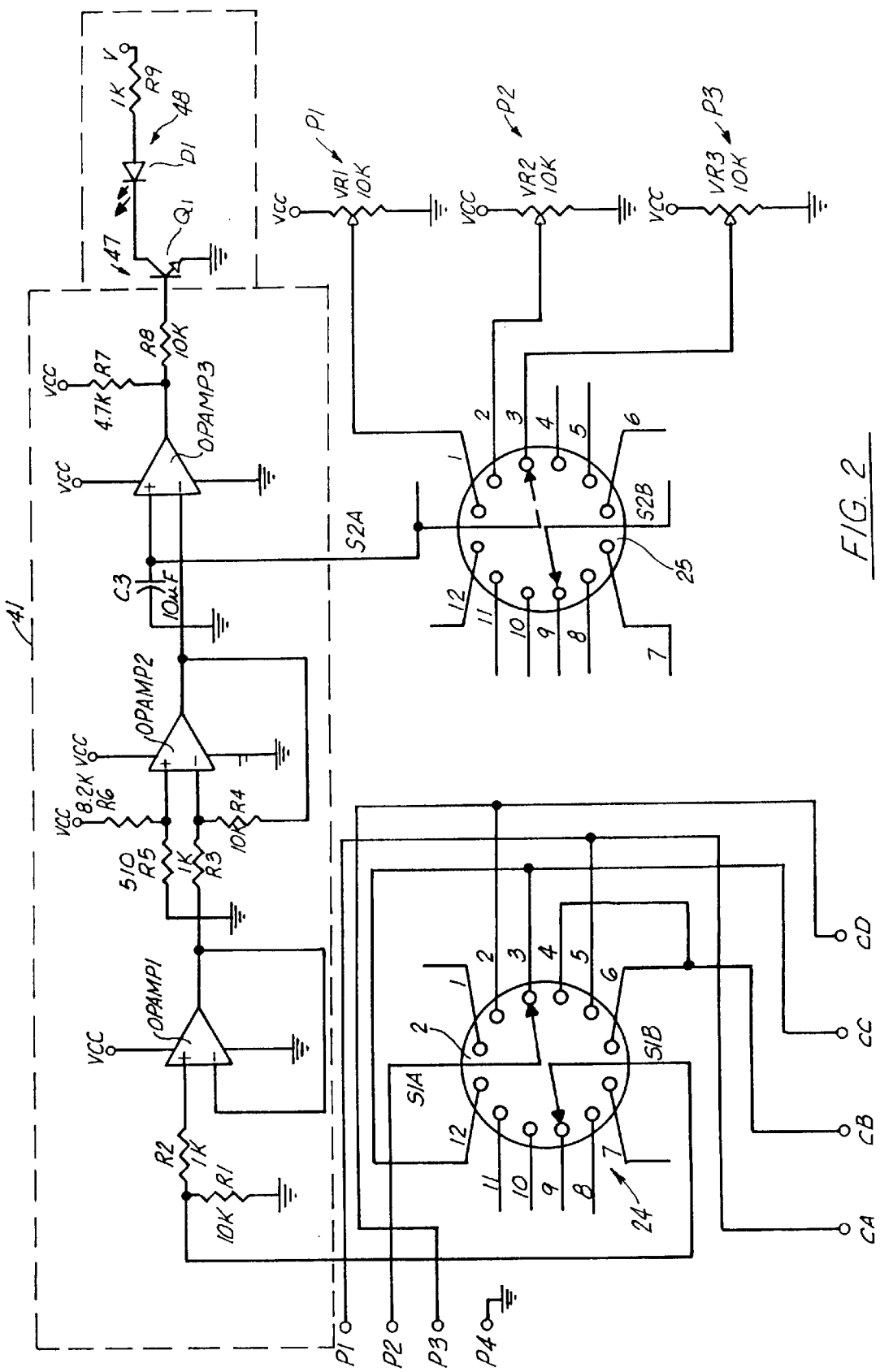
FIG. 2 illustrates the pneumatic circuit of the embodiment of FIG. 1.

FIG. 2 illustrates the pneumatic circuit 40 of the invention 10. Nozzle 12 is connected to control valve 13. Nozzle provides connection to the intake port of the solenoid. Control valve 13 controls the air supplied to nozzle 12 during the testing procedure. Port 14 is a standard male quick disconnect air fitting for connection to the air supply (not shown). Port 14 may be connected to any regulated shop air supply or a separately supplied manifold. Additional manifolds and clamps are required for securing the solenoid when testing a duty-cycled solenoid. Internal manifold 45 connects port 14 to nozzle 12 thereby providing air supply to nozzle 12 under the control of control valve 13. Pressure gauge 11 monitors the air pressure during testing of the solenoid.

FIG. 3 illustrates circuits 50 and 51 of invention 10. Power plug 55 provides a connection to supply power to the electronic circuitry of the present invention. Apparatus 10 can be powered electrically by any suitable twelve volt direct current source capable of delivering at least five amperes of electrical power. Additionally, in order to test a solenoid in a vehicle, power plug 55 can be adapted to connect to a vehicle's cigarette lighter so that it is not necessary to carry a power source when operating the present invention. Henceforth, the single testing unit is capable of testing individual computer controlled automatic transmission solenoids both electrically and pneumatically once they have been removed from the vehicle or while in the vehicle. Power plug 55 is connected to protection circuitry 51 via leads 1 and 2. Lead 1 of power plug 55 is connected to one side of fuse 54 for providing current overload protection to circuit 50. Lead 2 is connected to ground and to one side of Zener diode 56 for providing over voltage surge protection. The other side of fuse 54 is connected to the other side of Zener diode 56. In the exemplary embodiment, Zener diode 56 is a 1.5KE20A diode and fuse 54 is a 5 amp fuse.

For performing the on/off test procedure, circuit 50 is provided with a two position push button switch 26 which is normally in the open position (as shown) thereby providing the circuitry with a ground or negative voltage potential for the external solenoid diode test. When switch 26 is closed, power from the output of protection circuitry 51 is supplied to the solenoid (not shown) during the on/off test via resistor R6 connected to jack 21. One side of resistor R6 is connected to switch 26 and the other side is connected to jack 21 and one side of resistor R2. The other side of resistor R2 is connected to the base of transistor Q1. Resistor R3 is connected to said other side of resistor R2 and to the emitter of transistor Q1. The emitter of transistor Q1 is further connected to ground. In the exemplary embodiment, transistor Q1 is a 2N3904 transistor. Resistors R2 and R3 are 4.7K ohm resistors. Resistor R6 is a 8.2 ohm resistor (10 watt ww).

Push button switch 24 (FIG. 4) when actuated supplies a reverse current to jack 22 through a current limiting resister R8 in circuit 60 (FIG. 4) for reverse biasing the external solenoid diode (not shown) during a diode test. Light emitting diode 25 illuminates indicating the external solenoid diode is properly functioning during the diode test. When the solenoid reverse biases, it will act as a shunt around the solenoid allowing resistor R8 in circuit 60 (FIG. 4) and resistor R6 to form a voltage divider circuit at jack 21. Transistor Q1 is then turned on allowing current to flow through light emitting diode 25 via current limiting resistor R1 at the collector of transistor Q1. Resistors R2 and R3 form a voltage divider circuit to the base of transistor Q1. If the external solenoid diode is missing or open then the voltage will drop across the solenoid preventing Q1 from turning on. Accordingly, light emitting diode 25 will remain off. In the exemplary embodiment, resistor R1 is a 1K ohm resistor.

FIG. 4 illustrates the electronic circuitry 60 for performing the modulated/duty-cycle solenoid test. Switch 29 turns on the electrical circuity of circuit 60. Switch 29 receives 12 Volts from circuit 50. Push button switch 24 (as shown) connects jack 22 to ground through current limiting resistor R7. Selector switch 27 is also connected to ground through current limiting resistor R7. Additionally, voltmeter 20 is connected to ground through resistor R7 and to jack 23. Thus, the duty-cycle pairings are negative 22, positive 23 (the on/off solenoid and diode test pairings are negative 22, positive 21). Switch 29 is connected to potentiometer 31 which is connected in series with resistor R10. Potentiometer 31 has a range from 0 to 5 volts. Resistor R10 is connected in series with potentiometer 28 which is connected in series with one terminal of resistor R12 to form a variable control voltage feed to one half of integrated circuit (IC) chip 62. Potentiometer 28 has a range from 0 to 5 volts. The other terminal of resistor R12 is connected to ground. In the exemplary embodiment, resistor R7 is a 2 ohm 10 Watt resistor. Potentiometers 28 and 31 are 500 ohm and 5K ohm potentiometers, respectively. Resistors R10 and R12 are 470 ohm and 300 ohm resistors, respectively.

Jack 23 is connected to the anode of light emitting diode 30 and the cathode of diode DS4. The cathode of light emitting diode 30 is connected to ground through resistor R9 used for current limiting and to the cathode of diode DS4. The anode of diode DS4 is connected to ground. Diode DS4 is provides a reverse current drain for the protection of electronic components in circuit 60. Jack 23 is further connected to polyswitch 61, shown as not connected (N/C), to protect the circuit 60 from overheating due to over current conditions and prevent light emitting diode 30 from illuminating. Polyswitch 61 is normally closed and will open upon overheating. Upon cooling, polyswitch 61 automatically resets. In the exemplary embodiment, diode DS4 is a 1N5822 diode.

Circuit 60 further comprises integrated (IC) chip 62 which is a LM556 dual timer having first and second stage timers, U1A and U1B, whereby in operation together provides an oscillating output to jack 23. IC chip 62 is supplied a positive 12 volt VCC to pin 14 of U1B. Pin 7 of U1A connects to a negative voltage or ground. Reset pins 10 and 4 are connected to a positive 12 volt VCC in order to keep IC chip 62 consistently active. Output pin 9 of U1B supplies U1A with a trigger at pin 6 and is connected to VCC through resistor R5. Control pin 11 of U1B is connected to ground through capacitor C4. Trigger and threshold pins 8 and 12, respectively, of U1B are connected to ground through capacitor C7 which are in turn connected to one terminal of resistor R14 and capacitor C8. The other terminal of capacitor C8 is connected to pin 8 of selector switch 27. The other terminal of resistor R14 is connected to discharge pin 13 of U1B. Resistor R14 and discharge pin 13 are connected to one terminal of resistor R15. The other terminal of R15 connects to two capacitors C3 with its other terminal at ground, C2 with its other terminal at ground, and R11 with its other terminal at 12 volt VSW source from push button 29. Resistors R15 and R11 and capacitors C2 and C3 function as a filter circuit. In the exemplary embodiment, capacitors C2, C3, C4, C7 and C8 are 10 microfarad, 0.01 microfarad, 0.01 microfarad, 0.22 microfarad and 1.5 microfarad capacitors, respectively. Resistors R5, R11, R13 and R15 are 4.7K ohm, 10 ohm, 2.2K ohm, and 23.2K ohm resistors, respectively.

The second stage timer U1A of IC chip 62 has threshold pin 2 and discharge pin 1 connected together. Pins 1 and 2 of U1A are further connected to ground through capacitor C5. Additionally, pins 1 and 2 are connected to one side of capacitor C6. One side of resistor R16 is connected to VCC and the other side is connected to pins 1 and 2 of U1A and said one side of capacitor C6. The other terminal of capacitor C6 is connected to pin 2 of selector switch 27. Control pin 3 of U1A is connected to potentiometer 28. The output of the dual timer IC chip 62 is supplied to output pin 5 of U1A. Output pin 5 is connected to the base of transistor Q2 via resistor R4. Transistor Q2 operates to turn on and off MOSFET Q3. The collector of transmitter Q2 is connected to the gate of MOSFET Q3 and the emitter of transmitter Q2 is connected to ground. MOSFET Q3 provides electronic power to jack 23. The gate of MOSFET Q3 is also connected to one terminal of resistor R13. The other terminal of R13 is connected to +12 volts VSW at switch 29. MOSFET Q3 has its drain connected to +12 VSW and one terminal of capacitor C1. The other terminal of capacitor C1 is connected to ground. MOSFET Q3 has its source connected to polyswitch 61 for supplying power to jack 23. Selector switch 27 adds capacitor C8 to the discharge circuit of U1B and adds C6 to the discharge circuit of U1A for increasing or decreasing the output of U1A resulting in the increases or decrease of the Hertz available at jack 23. Selector switch 27 comprises 14 pins, pins 1 and 7 are high settings; and, pins 2 and 8 are low settings. Pin 14 is connected to ground and to pin 9 of selector switch 27. Pin 13 is connected to ground and pin 3 of selector switch 27. In the exemplary embodiment, transistor Q2 is a 2N3904 transistor. MOSFET Q3 is a IRF954 MOSFET. Capacitors C1, C5, C6, and C8 are 47 microfarad, 0.047 microfarad, 0.33 microfarad and 1.5 microfarad capacitors, respectively. Resistors R4, R13 and R16 are 4.7K ohm, 2.2K ohm and 64.9K ohm resistors, respectively. When the high and low settings are grounded, capacitance is added to the circuit by $C_i$ and $C_8$, resulting in lowering of the frequency.

The following description will be referring to the pneumatic connection to the solenoid under test and the on/off and modulated/duty-cycled testing procedures for operation of the present invention 10. The operator of the present invention 10 may bench test the solenoid while the solenoid is removed from the vehicle by connecting the power plug 55 to any 12-Volt direct current source capable of delivering at least five (5) amperes of electrical power. On the other hand, when testing the solenoid in the vehicle the operator may connect the present invention 10 to the vehicle's cigarette lighter.

Before performing the on/off or modulated/duty-cycled testing, apparatus 10 is pneumatically connected to the solenoid. When pneumatically connecting the apparatus to the solenoid, air control valve 13 should be closed by turning the valve arm down until it is horizontal or parallel to the faceplate 15. After closing air control valve 13, regulated air supply can be connected to port 14. The air supply to nozzle 12 is then adjusted to 30 psi for the on/off test and 50 psi for the modulated/duty-cycled test. The corresponding leads should be applied to jacks 21 and 22 for the on/off test and jacks 22 and 23 for the modulated/duty-cycled test. If a solenoid has only one wire, jack 22 can be connected to the solenoid's metal case by conventional means.

For connecting to an on/off solenoid, the solenoid is to be placed onto the rubber nozzle 12 by aligning the solenoid hole directly over the hole in the nozzle 12. Once the solenoid is secured in place, valve 13 is moved perpendicular to the faceplate, thereby allowing air to flow into the solenoid under test.

When performing the modulated/duty-cycled test, a separately supplied manifold is required. The separately supplied manifold is then connected to port 14 using a standard female quick disconnect air fitting provided on the separately supplied manifold. The separately supplied manifold may require the solenoid be energized prior to providing any air pressure to the solenoid. The solenoid is secured to the separately supplied manifold via a F-clamp.

Upon completion of the pneumatic connection, as described above, the on/off testing is performed by actuating switch 26 thereby energizing the solenoid under test. The circuitry is designed to limit amperage to 1.6 amps. As the air pressure flows through the intake port of the solenoid, the operator will observe changes in air pressure on the pressure gauge 11. Specifically, a slight drop in pressure will be seen as the pressure flows through the intake port of the solenoid indicating the solenoid is functioning properly. On the other hand, if the pressure does not drop the solenoid has failed to open thereby indicating a faulty solenoid. For open type solenoids, a slight rise in pressure will be seen. Henceforth, the pneumatic integrity of the solenoid has been determined. The pneumatic operation of the solenoid may be further determined by deenergizing the solenoid and monitoring the air flow through valve 13. In further operation, light emitting diode 25 will illuminate if the solenoid is functioning properly; otherwise, light emitting diode 25 will remain off if the solenoid is electrically faulty whereby the electrical integrity of the solenoid has been determined.

Upon completion of the on/off solenoid test, a diode test is performed on an external solenoid diode, of a 15 ohm or higher solenoid, by actuating switch 24. Light emitting diode 25 will illuminate if the external solenoid diode is functioning properly. On the other hand, light emitting diode 25 will remain off if the external solenoid diode is missing or faulty.

Alternately, upon completion of the pneumatic connection, as described above, the modulated/duty-cycled test may be performed. The selector switch 27 should be set on high or low in accordance with Table 1 set forth below.

TABLE 1

| Setting | Hertz | Solenoid |
|---------|-------|----------|
| HIGH | 220 cycles per second | Pressure control variable force (U.S.) |
| LOW | 30 cycles per second | Modulated converter clutch (U.S.) |
| LOW | 30 cycles per second | Pressure control (Asian) |

Switch 29 is then actuated to turned on circuitry 60. Potentiometer 28 is manipulated to calibrate voltmeter (20) to 5 volts when the selector switch 27 is set on HIGH. If selector switch 27 is set on LOW, potentiometer 28 is manipulated to calibrate voltmeter (20) in accordance with the highest voltage specified for the solenoid. Finally, potentiometer 31 is manipulated to set the duty cycle voltage to the lowest voltage specified for a solenoid.

Since describing the test procedures for all solenoids that the present invention 10 is applicable to is prohibitive, a description of the procedure for testing a MCC-4L80E solenoid is provided below. Selector switch 27 is set on LOW and switch 29 is actuated to supply power to the circuitry 60. Potentiometer 28 is manipulated to calibrate the voltmeter (20) to 5 volts, the highest specified voltage. Potentiometer 31 is manipulated to 1 volt by observing the voltage drop on voltmeter (20). While manipulating the potentiometer 31 to 1 volt, a corresponding drop in air pressure as seen on pressure gauge 11 should be observed. The drop in air pressure will be in the range of 40 psi to 0 psi.

Because many varying and differing embodiments may be made within the scope of the inventive concept herein taught and because many modifications may be made in the embodiment herein detailed in accordance with the descriptive requirement of the law, it is to be understood that the details herein are to be interpreted as illustrative and not in a limiting sense.

What is claimed as invention is:

1. An apparatus having first and second test modes for testing a solenoid in a computer controlled transmission comprising:
    (a) first switch means of a first test mode circuit means for energizing the solenoid to perform said first test mode when the solenoid is of a first mode of operation;
    (b) second switch means for connecting the solenoid to ground to perform said first test mode or said second test mode wherein actuating said second switch means performs a diode test; and,
    (c) third switch means for energizing a second test mode circuit means for performing said second test mode when the solenoid is of a second mode of operation, wherein said first and the second test modes are on/off and modulated/duty-cycled, respectively.

2. The apparatus of claim 1, wherein said second test mode circuit means comprises:
    (a) control means coupled to said third switch means for controlling a duty cycle;
    (b) range adjustment control means coupled to said control means for setting a voltage output;
    (c) dual timer means coupled to said range adjustment control means for providing an oscillating output to a positive side of the solenoid;
    (d) selecting means coupled to said third switch means for selecting a frequency; and,
    (e) meter means coupled to said positive side of the solenoid and said second switch means for indicating a voltage drop.

3. The apparatus of claim 2, wherein said second test mode circuit means further comprises protection means coupled to said dual timer means for providing overheating protection.

4. The apparatus of claim 2, wherein said dual timer means comprises a first stage and a second stage wherein said first stage is coupled to a filter means, the second stage of said dual timer means and to said selecting means; and said second stage of said dual timer means is coupled to said range adjustment control means and said selecting means.

5. The apparatus of claim 9, further comprising pneumatic means wherein the pneumatic means comprises:
    (a) port means for receiving air pressure;
    (b) nozzle means coupled to said port means for providing said air pressure to the solenoid;
    (c) control valve coupled to said nozzle means for controlling said air pressure from said nozzle means to the solenoid; and,
    (d) pressure gauge means for indicating air pressure flowing through the solenoid.

6. The apparatus of claim 1, further comprises protection means coupled to said first test mode circuit means for providing over current and over voltage protection.

7. The apparatus of claim 1, wherein said first and second test modes are performed on the solenoid when the solenoid is removed from a vehicle or while the solenoid is in the vehicle.

8. An apparatus having first and second test modes for bench testing a solenoid having first or second modes of operation in a computer controlled transmission when the solenoid is removed from a vehicle or while the solenoid is in the vehicle, the apparatus comprising:
    (a) first test mode circuit means for performing said first test mode;
    (b) second test mode circuit means for performing said second test mode; and, (c) switch means coupled to said first test mode circuit means and said second test mode circuit means for providing ground or negative potential to a negative side of the solenoid when performing said first test mode or said second test mode, wherein when actuated a diode test is performed, wherein said first and the second test modes are on/off and modulated/duty-cycled, respectively.

9. The apparatus of claim 8, wherein said second test mode circuit means comprises:
    (a) control means coupled to said third switch means for controlling a duty cycle;
    (b) range adjustment control means coupled to said control means for setting a voltage output;
    (c) dual timer means coupled to said range adjustment control means for providing an oscillating output to a positive side of the solenoid;
    (d) selecting means coupled to said third switch means for selecting a frequency; and,
    (e) meter means coupled to said positive side of the solenoid and said second switch means for indicating a voltage drop.

10. The apparatus of claim 8, further comprising pneumatic means wherein the pneumatic means comprises:
    (a) port means for receiving air pressure;

(b) nozzle means coupled to said port means for providing said air pressure to the solenoid;

(c) control valve coupled to said nozzle means for controlling said air pressure from said nozzle means to the solenoid; and, (d) pressure gauge means for indicating air pressure flowing through the solenoid.

* * * * *